(12) United States Patent
Jang et al.

(10) Patent No.: US 10,122,336 B1
(45) Date of Patent: Nov. 6, 2018

(54) BROADBAND HARMONIC MATCHING NETWORK

(71) Applicant: Infineon Technologies AG, Neubiberg (DE)

(72) Inventors: Haedong Jang, San Jose, CA (US); Richard Wilson, Morgan Hill, CA (US); Timothy Canning, Morgan Hill, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/709,593

(22) Filed: Sep. 20, 2017

(51) Int. Cl.
| | |
|---|---|
| H03F 3/191 | (2006.01) |
| H03F 3/60 | (2006.01) |
| H03F 3/24 | (2006.01) |
| H03F 3/217 | (2006.01) |

(52) U.S. Cl.
CPC ............. *H03F 3/608* (2013.01); *H03F 3/191* (2013.01); *H03F 3/217* (2013.01); *H03F 3/245* (2013.01); *H03F 2200/39* (2013.01); *H03F 2200/534* (2013.01)

(58) Field of Classification Search
CPC ...................................... H03F 3/191
USPC ........................ 330/302, 305, 277
See application file for complete search history.

(56) References Cited

U.S. PATENT DOCUMENTS

| | | |
|---|---|---|
| 5,177,453 A | 1/1993 | Russell et al. |
| 6,734,728 B1 | 5/2004 | Leighton et al. |
| 6,879,224 B2 * | 4/2005 | Frank ................... H03H 7/0115 333/189 |
| 7,489,188 B2 | 2/2009 | Lee et al. |
| 7,760,027 B2 | 7/2010 | Murji et al. |

(Continued)

FOREIGN PATENT DOCUMENTS

| | | |
|---|---|---|
| CN | 205945655 U | 2/2017 |
| WO | 2016057218 A1 | 4/2016 |
| WO | 2016207600 A1 | 12/2016 |

OTHER PUBLICATIONS

Arigong, Bayaner et al., "RF Amplifier with Dual Frequency Response Capacitor", U.S. Appl. No. 15/667,195, filed Aug. 2, 2017, 1-34.

(Continued)

*Primary Examiner* — Henry Choe
(74) *Attorney, Agent, or Firm* — Murphy, Bilak & Homiller, PLLC

(57) ABSTRACT

An amplifier circuit includes an RF amplifier that is configured to amplify an RF signal between a first terminal and a second terminal across an RF frequency range. The amplifier circuit includes a multi-stage impedance matching network having a broadband impedance transformer, a phase shifter, and a high-pass impedance transformer connected in series with one another between a first port of the amplifier circuit and the first terminal. The broadband impedance transformer provides impedance transformation in the RF frequency range. The phase shifter shifts a phase output port reflection coefficient in a second order harmonic frequency range that overlaps with a second order harmonic of the fundamental RF frequency. The high-pass impedance transformer transmits an RF signal in the RF frequency range while providing impedance transformation in the RF frequency range and transmits RF signals in the second order harmonic frequency range with low impedance.

20 Claims, 5 Drawing Sheets

(56) References Cited

U.S. PATENT DOCUMENTS

| | | | | |
|---|---|---|---|---|
| 7,800,448 | B2* | 9/2010 | Blednov | H03F 1/0288 330/124 R |
| 8,193,857 | B1 | 6/2012 | Wilson | |
| 8,253,496 | B2 | 8/2012 | Ichitsubo et al. | |
| 8,593,219 | B1* | 11/2013 | Root | H03F 1/0288 330/124 R |
| 8,717,099 | B2 | 5/2014 | Wilson et al. | |
| 8,717,102 | B2 | 5/2014 | Wilson et al. | |
| 9,419,568 | B2 | 8/2016 | Beltran et al. | |
| 9,425,756 | B2* | 8/2016 | Åkesson | H03F 1/0288 |
| 9,503,025 | B2 | 11/2016 | Cao et al. | |
| 2011/0230149 | A1* | 9/2011 | Kuriyama | H03F 1/0205 455/127.1 |
| 2015/0200631 | A1 | 7/2015 | Outaleb | |
| 2015/0243649 | A1 | 8/2015 | Brech et al. | |
| 2016/0105153 | A1 | 4/2016 | Chen et al. | |
| 2016/0142020 | A1 | 5/2016 | Wang | |
| 2017/0359032 | A1* | 12/2017 | McLaren | H03F 1/0288 |
| 2017/0366148 | A1 | 12/2017 | Jang et al. | |
| 2017/0373645 | A1 | 12/2017 | Jang et al. | |

OTHER PUBLICATIONS

Canning, Timothy et al., "Compact Class-F Chip and Wire Matching Topology", Specification of U.S. Appl. No. 15/386,039, filed Dec. 21, 2016, pp. 1-29.

Chen, Kenle et al., "A 3.1-GHz Class-F Power Amplifier With 82% Power-Added-Efficiency", IEEE Microwave and Wireless Components Letters, vol. 23, No. 8, Aug. 2013, 436-438.

Doherty, W. H., "A New High Efficiency Power Amplifier for Modulated Waves", Proceedings of the Institute of Radio Engineers, vol. 24, No. 9, Sep. 1936, pp. 1163-1182.

Goel, Saurabh et al., "LC Network for a Power Amplifier with Selectable Impedance", Specification of U.S. Appl. No. 15/078,298, filed Mar. 23, 2016, pp. 1-32.

Gozzie, Cristian et al., "Embedded Harmonic Termination on High Power RF Transistor", Specification of U.S. Appl. No. 15/421,567, filed Feb. 1, 2017, pp. 1-20.

Liu, Yang et al., "Semiconductor Package with Integrated Harmonic Termination Feature", Specification of U.S. Appl. No. 15/610,805, filed Jun. 1, 2017, pp. 1-26.

Wilson, Richard et al., "Enhanced Instantaneous Bandwidth LDMOS RF Power Transistor Using Integrated Passive Devices", 2016 IEEE MTT-S International Microwave Symposium (IMS), May 22-27, 2016, 1-4.

Zhu, Ning et al., "An Integrated RF Match and Baseband Termination Supporting 395 MHz Instantaneous Bandwidth for High Power Amplifier Applications", 2017 IEEE MTT-S International Microwave Symposium (IMS), Jun. 4-9, 2017, 1114-1117.

Chen, Kenle et al., "Design of Highly Efficient Broadband Class-E Power Amplifier Using Synthesized Low-Pass Matching Networks", Reprinted from IEEE Transactions on Microwave Theory and Techniques, vol. 59, No. 12, Dec. 2012, pp. 1-12.

Gao, S et al., "High-efficiency power amplifier design including input harmonic termination", IEEE Microwave and Wireless Components Letters, vol. 16, Issue 2, Feb. 2006, pp. 81-83.

Jundi, A et al., "An 85-W Multi-Octave Push-Pull GaN HEMT Power Amplifier for High-Efficiency Communication Applications at Microwave Frequencies", IEEE Transactions on Microwave Theory and Techniques, vol. 63, Issue 11, Nov. 2015, pp. 3691-3700.

Mahadeskasaei, Seyed A. et al., "Design of Broadband, High-Efficiency, and High-Linearity GaN HEMT Class-J RF Power Amplifier", Progress in Electromagnetic Research C, vol. 72, 2017, pp. 177-186.

White, P M., "Effect of input harmonic terminations on high efficiency class-B and class-F operation of PHEMT devices", Microwave Symposium Digest, 1998 IEEE MTT-S International, Jun. 1998, pp. 1611-1614.

\* cited by examiner

BROADBAND HARMONIC MATCHING NETWORK

FIELD OF TECHNOLOGY

The present application relates to RF (radio frequency) amplifiers, in particular impedance matching networks for RF amplifiers.

BACKGROUND

RF power amplifiers are used in a variety of applications such as base stations for wireless communication systems etc. RF power amplifiers are designed to provide linear operation without distortion. The signals amplified by the RF power amplifiers often include signals that have a high frequency modulated carrier having frequencies in the 400 megahertz (MHz) to 4 gigahertz (GHz) range. The baseband signal that modulates the carrier is typically at a relatively lower frequency and, depending on the application, can be up to 300 MHz or higher.

A device package for an RF power amplifier can include a transistor die (e.g., MOSFET (metal-oxide semiconductor field-effect transistor), LDMOS (laterally-diffused metal-oxide semiconductor), HEMT (high electron mobility transistor) along with an input and output impedance matching circuit incorporated therein. The input and output impedance matching circuits typically include LC networks that provide at least a portion of an impedance matching circuit that is configured to match the impedance of the transistor die to a fixed value. These input and output impedance matching circuits are used to match the relatively low characteristic impedances of RF transistors (e.g., impedances (e.g., around 2 ohms or less for high power devices), to a fixed impedance value (e.g., 50 ohms). These input and output impedance matching circuits are frequency selective and introduce impedance dispersion versus frequency, which results in band limited power amplifier operations. The impedances presented to the devices in the higher order harmonic frequency ranges significantly impact the performance of the amplifier, and in particular the efficiency of the amplifier. In conventional impedance matching networks, impedance transformation is typically satisfactory only in a limited frequency range. For example, an optimized input matching network requires a frequency response in terms of source reflection coefficient at the second harmonic frequency to present a certain range of phases in order to obtain consistent performances versus frequency with minimal variation. Outside of this range of phases, efficiency is dramatically degraded.

Conventionally, impedance matching networks are tuned primarily at the center frequency of the fundamental frequency range. The phase of the second harmonic reflection coefficient is implicitly determined without an explicit design parameter. Therefore, it is difficult to be applied to multiple device characteristics. One technique for optimizing amplifier efficiency involves introducing a resonant circuit (e.g., an LC resonator) that is configured to provide a second harmonic short (180°) at the input of the device. In such a design, the efficiency performance is close to the maximum when the second harmonic phase is close to the short (180° in phase). However, in such a circuit, the second harmonic frequency response is highly dispersive. Thus, while the second harmonic short improves narrowband performance, this topology suffers from decreased broadband performance.

SUMMARY

An amplifier circuit is disclosed. According to an embodiment, the amplifier circuit includes an RF amplifier that is configured to amplify an RF signal as between a first terminal and a second terminal across an RF frequency range that includes a fundamental RF frequency. The amplifier circuit further includes a multi-stage impedance matching network comprising a broadband impedance transformer, a phase shifter, and a high-pass impedance transformer. The broadband impedance transformer, the phase shifter, and the high-pass impedance transformer are connected in series with one another between a first port of the amplifier circuit and the first terminal. The broadband impedance transformer transmits the RF signal in the RF frequency range while providing impedance transformation in the RF frequency range. The phase shifter shifts a phase output port reflection coefficient in a second order harmonic frequency range that overlaps with a second order harmonic of the fundamental RF frequency. The high-pass impedance transformer transmits an RF signal in the RF frequency range while providing impedance matching in the RF frequency range and transmits RF signals in the second order harmonic frequency range with low impedance.

An impedance matching circuit is disclosed. According to an embodiment, the impedance matching circuit includes a network of reactive components that are configured to match a characteristic impedance of an amplifier device to a fixed impedance value across an RF frequency range that includes a fundamental RF frequency. The network of reactive components includes a high-pass impedance transformer, a phase shifter and a broadband impedance transformer connected in series with one another between an input port and an output port of the impedance matching circuit. Parameters of the broadband impedance transformer are such that the broadband impedance transformer transmits an RF signal in the RF frequency range while providing impedance transformation in the RF frequency range. Parameters of the phase shifter are such that higher order harmonics of the RF signal are phase shifted while the RF signal in the RF frequency is transmitted with matched impedance. Parameters of the high-pass impedance transformer are such that high-pass impedance transformer transforms an impedance of the RF signal in the RF frequency range while transmitting with low reflection RF signals that are in a second order harmonic frequency range that overlaps with a second order harmonic of the fundamental RF frequency.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A, 3B, and 3C, depicts RF characteristics and a configuration of a broadband impedance transformer, according to an embodiment. FIGS. 3A and 3B depict S-parameters of the broadband impedance transformer. FIG. 3C depicts a possible circuit topology of the broadband impedance transformer, according to an embodiment.

FIGS. 4A, 4B, 4C, and 4D depicts RF characteristics and a configuration of a phase shifter, according to an embodiment. FIGS. 4A and 4B depict S-parameters of a circuit that includes the broadband impedance transformer and the phase shifter.

FIGS. 4C and 4D depict possible circuit topologies of the phase shifter, according to an embodiment.

FIGS. 5A, 5B, and 5C, depicts RF characteristics and a configuration of a high-pass impedance transformer, according to an embodiment. FIGS. 5A and 5B depict S-parameters of a circuit that includes the broadband impedance transformer, the phase shifter, and the high-pass impedance transformer. FIG. 5C depicts a possible circuit topology of the high-pass impedance transformer, according to an embodiment.

DETAILED DESCRIPTION

According to embodiments disclosed herein, an amplifier circuit includes an amplifier device that is configured to amplify an RF signal as between a first terminal and a second terminal across an RF frequency range. The amplifier circuit additionally includes a multi-stage impedance matching network. The multi-stage impedance matching network can be connected to either one or both of the first and second terminals of the amplifier device. The multi-stage impedance matching network includes three separate networks that are connected in series with one another, namely: a broadband impedance transformer, a phase shifter, and a high-pass impedance transformer.

The multi-stage impedance matching network advantageously controls the phase of the second harmonic reflection coefficient at the various stages of the network. In this way, the circuit can always be operated at the optimum or near optimum phase angle for efficient tuning of the second order harmonic while simultaneously providing impedance matching across a wideband RF frequency range. The broadband impedance transformer provides impedance transformation across a broadband RF frequency range that includes the fundamental (center) frequency. Meanwhile, the broadband impedance transformer is highly reflective at second order harmonics of the RF frequency range. The phase shifter controls the location of the second harmonic reflection coefficients for the broadband operation of devices. The high-pass input match transforms the complex device input impedance to increased real impedance while transferring the higher harmonic components to next stages of the multi-stage impedance matching network.

Figure 1:
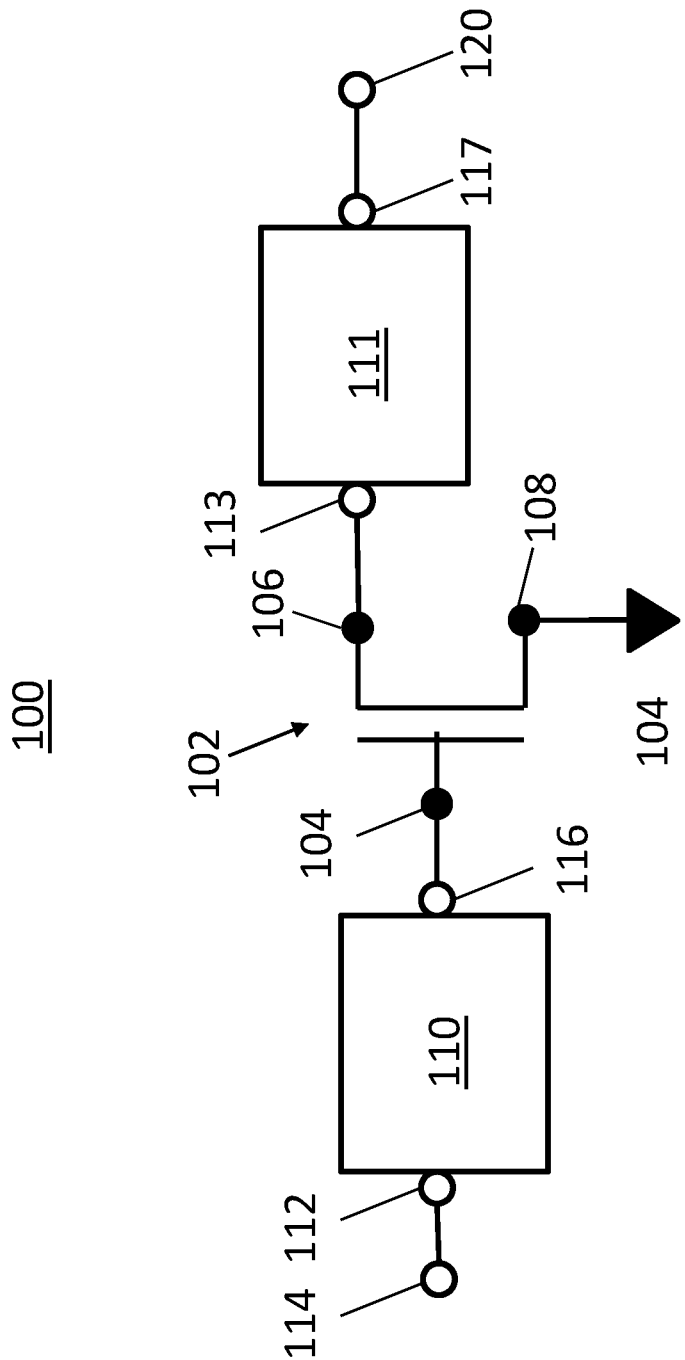
FIG. 1 depicts a high-level schematic of amplifier circuit that includes an RF amplifier and multi-stage impedance matching networks connected to the input and output of the RF amplifier, according to an embodiment.

Referring to FIG. 1, an amplifier circuit 100 is depicted, according to an embodiment. The amplifier circuit 100 includes an RF amplifier 102 configured to amplify an RF signal as between a first terminal 104 and a second terminal 106. The RF amplifier 102 and the complete amplifier circuit 100 can be a multi-carrier amplifier, a multiband amplifier, an LTE (long term evolution) compliant amplifier, a WCDMA (wideband code division multiple access) compliant amplifier, an 802.11(x) compliant amplifier, etc.

In various embodiments, the RF amplifier 102 can be a power transistor such as a MOSFET (metal-oxide semiconductor field-effect transistor), DMOS (double-diffused metal-oxide semiconductor) transistor, GaN HEMT (gallium nitride high electron mobility transistor), GaN MES-FET (gallium nitride metal-semiconductor field-effect transistor), LDMOS transistor, etc. and more generally any type of RF transistor device. In the depicted embodiment, the RF amplifier 102 is a transistor device, wherein the first terminal 104 corresponds to a control terminal or gate terminal of the transistor device and the second terminal 106 corresponds to an output terminal (e.g., the drain terminal) of the transistor device. The transistor device additionally includes a third terminal 108 that corresponds to a reference potential terminal (e.g., the source terminal) of the transistor that may be connected to a reference potential (e.g., GND).

The amplifier circuit 100 is configured to operate in a wideband frequency range. In contrast to narrowband, wideband refers to the fact that the range of frequency values for the RF signal exceeds the coherence bandwidth of a single channel. The amplifier circuit 100 provides, within acceptable tolerances, the same characteristics across the wideband frequency range. The wideband frequency range can span at least 20% of a center frequency (e.g., 1.8 GHz to 2.2 GHz, wherein the center frequency is 2.0 GHz) and can span 40% of a center frequency or more. These values represent just one example, and the wideband frequency range is scalable other frequencies.

The amplifier circuit 100 further includes a multi-stage input impedance matching network 110 connected to the first terminal 104 of the RF amplifier 102 and a multi-stage output impedance matching network 111 connected to the second terminal 106 of the RF amplifier 102. As is generally known in the art, optimum power transfer occurs when input and output impedances are matched as complex conjugates of one another. Typically, transistor devices such as GaN based HEMT have relatively low characteristic input and output impedances (e.g., 2 ohms or less). The general purpose of the multi-stage impedance input and output matching networks 110, 111 is to match these characteristic input and output impedances to a fixed value (e.g., 50 ohms), which corresponds to a standardized value at the system level. In this way, optimum power transfer between the amplifier circuit 100 and other components at the system level can be achieved. On the input side of the amplifier circuit 100, an input port 112 of the multi-stage input impedance matching network 110 connects to an input port 114 of the of the amplifier circuit 100 and an output port 116 of the multi-stage impedance matching network 110 connects to the first terminal 104 of the RF amplifier 102. On the output side of the amplifier circuit 100, the input port 113 of the multi-stage output impedance matching network 111 connects to the second terminal 106 of the RF amplifier 102 and the output port 117 of the output multi-stage impedance matching network 111 connects to an output port of the amplifier circuit 100.

Figure 2:
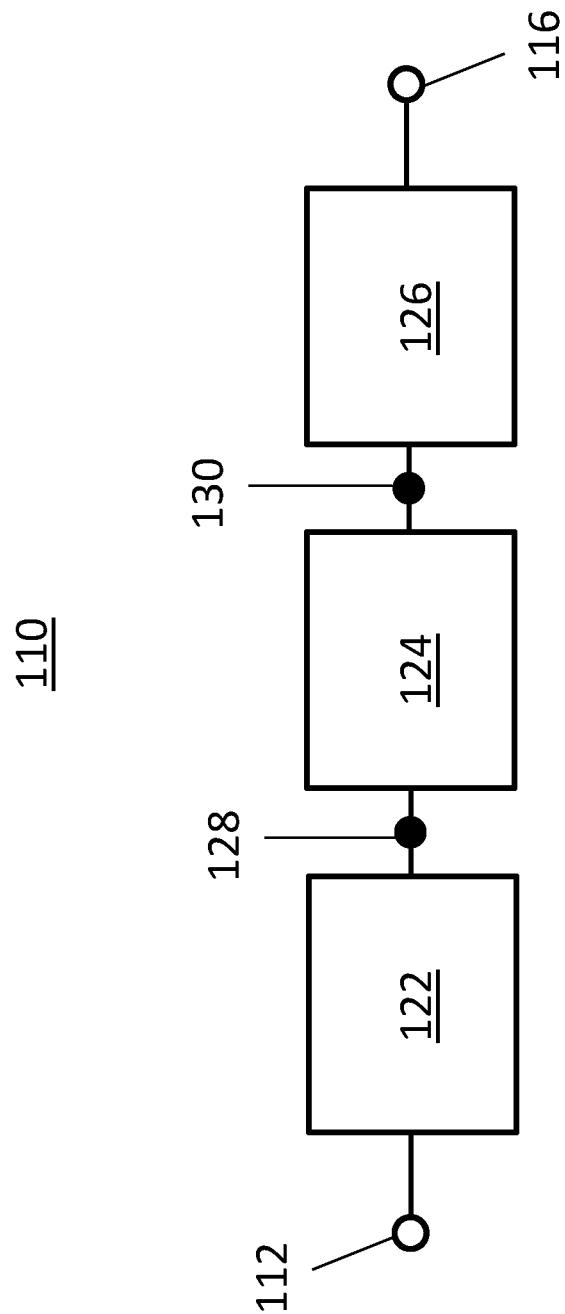
FIG. 2 depicts a high-level schematic of a multi-stage impedance matching network, according to an embodiment.

The topology and frequency characteristics of the various stages of the multi-stage impedance matching network 110 will be discussed in further detail below with reference to FIGS. 3-5. In this discussion, the multi-stage input impedance matching network 110 that is connected to the first terminal 104 of the RF amplifier 102 is described as a working example. The same concepts may be used to design the circuit topology and frequency response of the multi-stage output impedance matching network 111 that is connected to the second terminal 106 of the RF amplifier 102, with the only difference being that the multi-stage output impedance matching network 111 is matched a characteristic output impedance in the output connected case of the RF amplifier 102 instead of a characteristic input impedance of the RF amplifier 102 in the input connected case. In various embodiments, the amplifier circuit can have either one or both of the multi-stage input and output impedance matching networks 110, 111 connected to the RF amplifier 102. Referring to FIG. 2, a high-level topology of the multi-stage impedance matching network 110 is depicted, according to an embodiment. The multi-stage impedance matching network 110 includes a broadband impedance transformer 122, a phase shifter 124, and a high-pass impedance transformer 126. The broadband impedance transformer 122, the phase shifter 124, and the high-pass impedance transformer 126 are connected in series with one another. More particularly, the broadband impedance transformer 122 is directly electrically connected between the input port 112 of the multi-stage impedance matching network 110 and a first internal node 128 of the multi-stage impedance matching network 110, the phase shifter 124 is electrically connected between the first internal node 128 of the multi-stage impedance matching network 110 and a second internal node 130 of the multi-stage impedance matching network 110, and the high-pass impedance transformer 126 is connected between the second internal node 130 of the multi-stage impedance matching network 110 and the output port 116 of the multi-stage impedance matching network 110.

Figure 3:
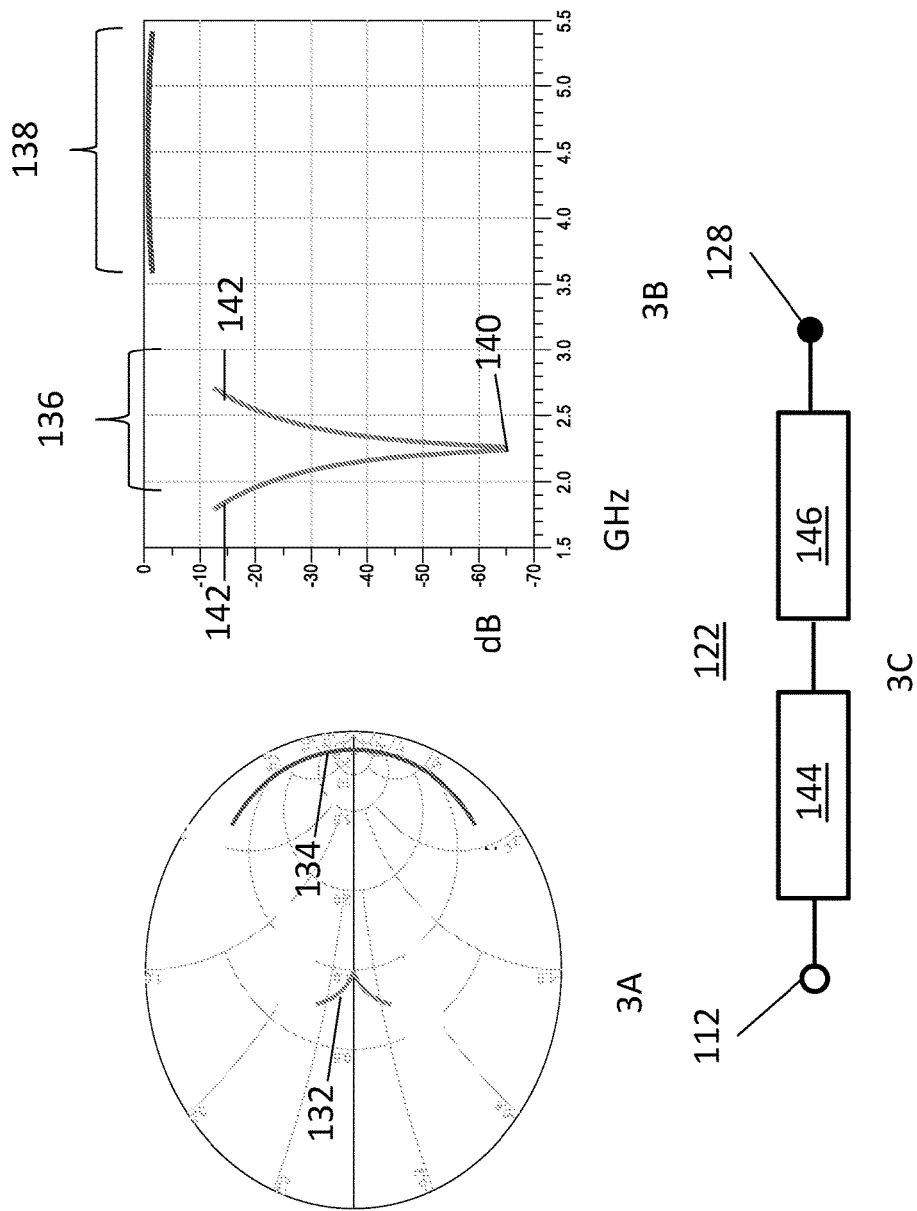
FIG. 3, which includes
Figure 4:
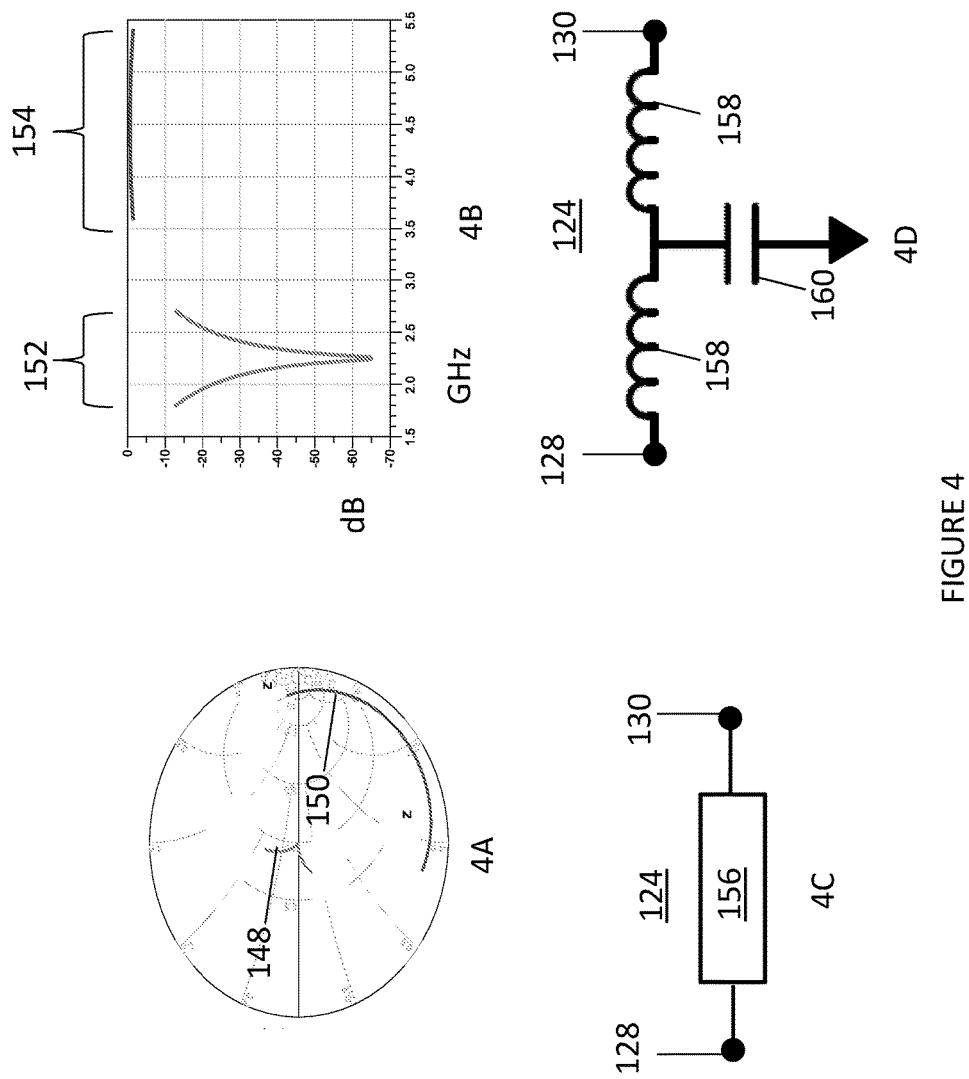
FIG. 4, which includes
Figure 5:
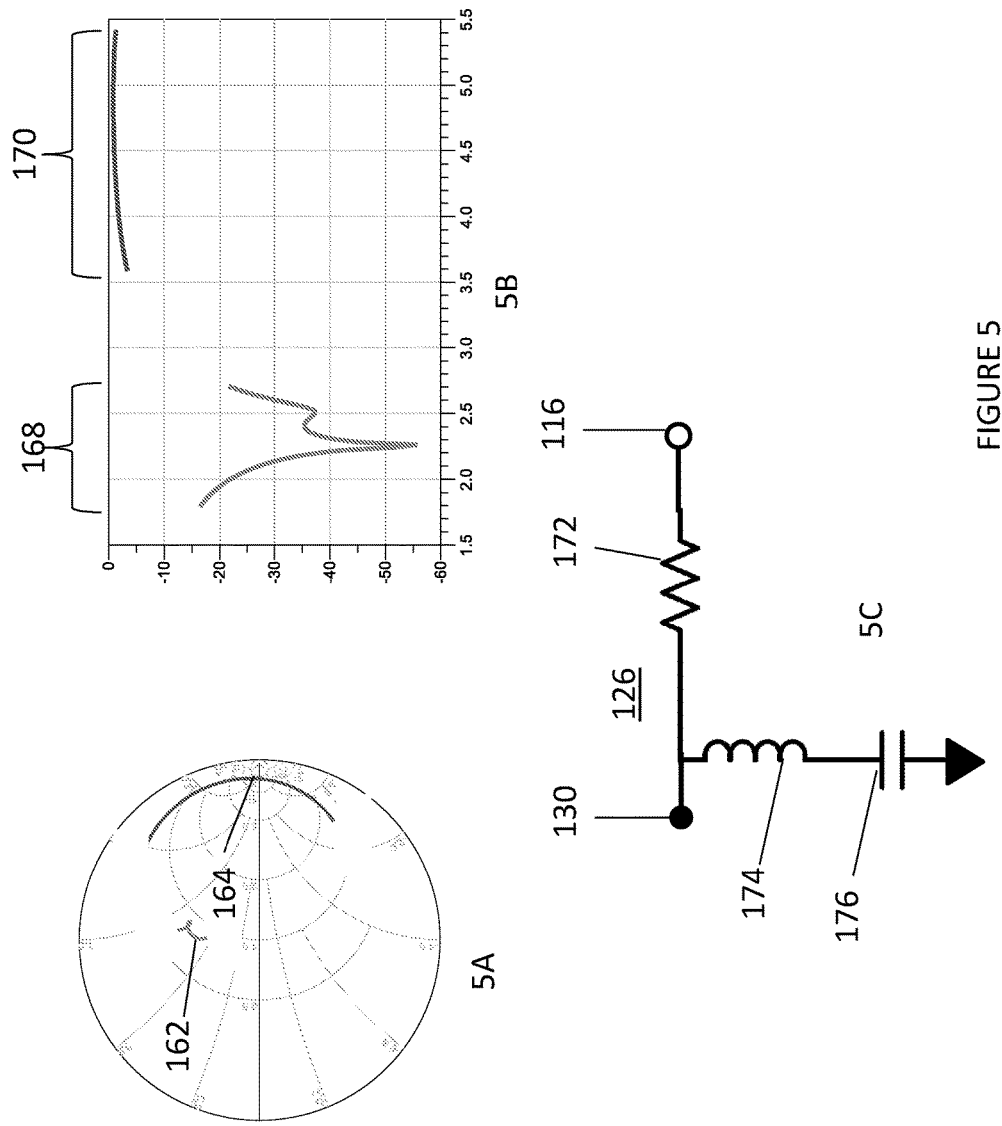
FIG. 5, which includes

FIGS. 3-5 disclose a frequency response and circuit topologies for the various stages of the multi-stage impedance matching network 110. In these examples, the parameters of the multi-stage impedance matching network 110 are tailored for high bandwidth impedance transformation fundamental RF frequency range of 1.8 GHz (gigahertz) to 2.7 GHz, with a center frequency of 2.25 GHz. Moreover, the parameters of the multi-stage impedance matching network 110 are tailored for high efficiency with respect to a second order harmonic frequency range of 3.6 GHz (gigahertz) to 5.4 GHz, with the second order harmonic center frequency being at 4.5 GHz. These values represent just one example. More generally, the principles described herein can be applied to tailor the parameters of the multi-stage impedance matching network 110 with respect to a wide variety of different frequency ranges, including fundamental frequencies in the range of 100 MHz to 10 GHz.

Referring to FIG. 3A, $S_{22}$ parameters of the broadband impedance transformer 122 are plotted on a Smith chart. These $S_{22}$ parameters correspond to the output port reflection coefficient of the broadband impedance transformer 122 as seen at the first internal node 128 of the multi-stage impedance matching network 110. A first plot 132 on the Smith chart corresponds to the $S_{22}$ parameters of the broadband impedance transformer 122 in the fundamental RF frequency range. A second plot 134 on the Smith chart corresponds to the $S_{22}$ parameters of the broadband impedance transformer 122 in the second order harmonic frequency range.

Referring to FIG. 3B, the $S_{22}$ parameters of the broadband impedance transformer 122 are plotted in (X, Y) coordinate format. The X axis corresponds to frequency in GHz (gigahertz) and the Y axis corresponds to magnitude of the output port reflection coefficient in dB (decibels). The $S_{22}$ parameters of the broadband impedance transformer 122 in the fundamental RF frequency range are shown in a first region 136 of the chart. The $S_{22}$ parameters of the broadband impedance transformer 122 in the second order harmonic RF frequency range are plotted in a second plot region 138 of the chart.

As can be seen, in the RF frequency range, the output port reflection coefficient of the broadband impedance transformer 122 includes a local minima 140 situated between two maxima 142. In the depicted embodiment, the two maxima 142 at either end of the fundamental RF frequency range (i.e., at 1.8 and 2.7 GHz) are at approximately −13 dB. Thus, the broadband impedance transformer 122 produces a return loss of no greater than −13 dB across the entire 900 MHz bandwidth of the fundamental RF frequency range. The local minima 140 of about −65 dB can be situated substantially close to or at 2.25 GHz, i.e., the center frequency of the RF frequency range. This profile represents just one example of a possible frequency response for the broadband impedance transformer 122. Generally speaking, the broadband impedance transformer 122 is configured to have very low output port reflection coefficients in the fundamental RF frequency range. For example, the maximum value of the output port reflection coefficients can be set at a particular value such that all other output port reflection coefficients in the fundamental frequency range are maintained below it. In one example, the frequency response for the broadband impedance transformer 122 can have more than one of the local minima, provided that the output port reflection coefficients remain below the desired value across the fundamental RF frequency range.

In the second order harmonic RF frequency range, the output port reflection coefficient of the broadband impedance transformer 122 remains relatively flat. Generally speaking, the broadband impedance transformer 122 is configured reflect most or all of the second order harmonic components of the RF signal at its output port. In the depicted embodiment, the output port reflection coefficient of the broadband impedance transformer 122 remains well above the two maxima of the fundamental RF frequency range. More particularly, in the second order harmonic RF frequency range, the output port reflection coefficient of the broadband impedance transformer 122 remains above −2 dB, or about eighty percent of a voltage magnitude of the RF signal. This is just one exemplary value. More generally, the output port reflection coefficient of the broadband impedance transformer 122 can remain above about twenty five percent of a voltage magnitude of the RF signal in some embodiments.

Referring to FIG. 3C, an exemplary circuit topology for the broadband impedance transformer 122 that can be used to produce the frequency response described with reference to FIGS. 3A and 3B is depicted, according to an embodiment. In this embodiment, the broadband impedance transformer 122 includes a first transmission line 144 connected in series with a second transmission line 146. The characteristic impedances of the transmission lines are chosen to transform the impedance as between the second internal node 130 of the multi-stage impedance matching network 110 and the input port 112 of the multi-stage impedance matching network 110. The parameters of the transmission lines can be chosen to have different frequency responses. For example, for a maximally flat impedance transformation response, the parameters of the transmission lines can be selected according to the following equations:

$$Z_2 = \sqrt{Z_{in2} \cdot \sqrt{Z_{in2} \cdot Z_{in3}}}, \text{ and}$$

$$Z_3 = \sqrt{Z_{in3} \cdot \sqrt{Z_{in2} \cdot Z_{in3}}},$$

wherein $Z_2$ is the characteristic impedance of the first transmission line 144, $Z_3$ is the characteristic impedance of the second transmission line 146, $Z_{in2}$, is the input impedance as seen at the first internal node 128 of the multi-stage impedance matching network 110 (i.e., the output port of the broadband impedance transformer 122), and $Z_{in3}$, is the input impedance as seen at the input port 112 of the multi-stage impedance matching network 110 (i.e., the input port of the broadband impedance transformer 122).

The frequency responses shown in FIGS. 3A and 3B correspond to a broadband impedance transformer 122 having the first and second transmission lines 144 that are tailored according to equations (1) and (2). Alternatively, other types of frequency responses can be used such as a Chebyshev response or any of a variety of broadband filtering techniques. Moreover, instead of configuring the broadband impedance transformer 122 with the first and second transmission lines 144, 146, other passive electrical components can be used. For example, the broadband impedance transformer 122 can be provided using a network of lumped elements, e.g., capacitors and inductors, wherein the parameters and topology of the lumped elements are tailored to provide the frequency responses shown in FIGS. 3A and 3B or other broadband frequency responses.

Referring to FIG. 4, the $S_{22}$ parameters of the multi-stage impedance matching network 110 as seen at the second internal node 130 are disclosed. The Smith chart of FIG. 4A and the frequency/reflection coefficient profile of FIG. 4B correspond to the Smith chart and frequency/reflection coefficient profile of FIG. 3A of FIG. 3B, respectively, under the same conditions, but for a combined circuit that includes the phase shifter 124 connected in series with the broadband impedance transformer 122. A third plot 148 on the Smith chart corresponds to the $S_{22}$ parameters of the combined circuit in the fundamental RF frequency range. A fourth plot 150 on the Smith chart corresponds to the $S_{22}$ parameters of the combined circuit in the second order harmonic frequency range. In FIG. 4B, corresponding $S_{22}$ parameters of the combined circuit are plotted in (X, Y) coordinate format. The $S_{22}$ parameters of the combined circuit in the fundamental RF frequency range are shown in a third region 152 of the chart. The $S_{22}$ parameters of the combined circuit in the second order harmonic RF frequency range are plotted in a fourth region 154 of the chart.

As can be seen, the effect of the phase shifter 124 is to rotate the output port reflection coefficient in the second order harmonic RF frequency range without substantially altering the frequency response of the circuit in the fundamental frequency range. This is shown in the fourth plot 150 of FIG. 4A, which is rotated in phase in comparison to the second plot 134 shown on FIG. 3A. The magnitude of the output port reflection coefficient, as compared between FIGS. 3B and 4B, is substantially unchanged.

Referring to FIGS. 4C and 4D, exemplary circuit topologies for the phase shifter 124 are depicted, according to an embodiment. Generally speaking, the parameters of the phase shifter 124 are tailored such that the phase shifter 124 has the same characteristic impedance in the fundamental frequency range as the output impedance of the broadband impedance transformer 122 as seen at the second internal node 130. Meanwhile, the parameters of the phase shifter 124 are tailored such that the phase shifter 124 shifts the phases of the output port reflection coefficient in the second order harmonic RF frequency range. That is, the phase shifter 124 is configured to transmit the RF signal to the broadband impedance transformer 122 with minimal (matched) impedance, while introducing a purely reactive impedance phase shift in the second order harmonic RF frequency range.

As shown in FIG. 4C, the phase shifter 124 can be implemented using a third transmission line. 156 Thus, the phase shifter 124 when combined with the broadband impedance transformer 122 can be implemented by three transmission lines. The characteristic impedance of the phase shifter 124 in the fundamental frequency range is tailored to be the same as the input impedance of the broadband impedance transformer 122 $Z_{in2}$ as seen at the first internal node 128 of the multi-stage impedance matching network 110. Meanwhile, the phase shifter 124 introduces a phase shift in the second order harmonic frequency range that shifts the phase of the output port reflection coefficient.

As shown in FIG. 4D, the phase shifter 124 can alternatively be provided using a network of lumped elements, e.g., inductors and capacitors. The elements are designed to have minimum insertion loss and intended phase shifts operating up to the second harmonic frequency. Therefore, the cut-off frequency of the network designed higher than the highest second harmonic frequency. The characteristic impedance is designed to be the same characteristic impedance of the third transmission line. For example, the inductances 158 and capacitances 160 of the 3-element lumped version of transmission line depicted in FIG. 3D can be calculated according to the following equations:

$$L_1 = \frac{Z_0}{\omega} \tan(\phi/2), \text{ and} \quad (3)$$

$$C_1 = \frac{\sin(\phi)}{\omega Z_0}, \quad (4)$$

wherein $Z_0$ is the characteristic impedance of the third transmission line, $\phi$ is the desired phase shift, and $\omega$ is the angular frequency where the phase shift is calculated. One advantage of the lumped element topology is that it can be implemented in an RF semiconductor package using chip capacitors to provide $C_1$ and inductive bond wires to provide $L_1$. Instead of a 3-element lumped element topology, other topologies such as a 5-element lumped element topology can be providing using similar principles.

Referring to FIG. 5, the $S_{22}$ parameters of the of the multi-stage impedance matching network 110 as seen at the output port 116 of the multi-stage impedance matching network 110 are depicted. That is, the Smith chart and frequency/reflection coefficient profiles as previously described in FIGS. 3A and 3B are reproduced in FIGS. 5A and 5B, respectively under the same conditions for a combined circuit that includes the phase shifter 124, the broadband impedance transformer 122 and the high-pass impedance transformer 126. Thus, the smith chart of FIG. 5A and the frequency/reflection coefficient profile of FIG. 5B show the output port reflection coefficient of the multi-stage impedance matching network 110 as observed at the first terminal 104 of the RF amplifier 102. A fifth plot 162 on the Smith chart corresponds to the $S_{22}$ parameters of the combined circuit in the fundamental RF frequency range. A sixth plot 164 on the Smith chart corresponds to the $S_{22}$ parameters of the combined circuit in the second order harmonic frequency range. In FIG. 5B, corresponding $S_{22}$ parameters of the combined circuit are plotted in (X, Y) coordinate format. The $S_{22}$ parameters of the broadband impedance transformer 122 in the fundamental RF frequency range are shown in a fifth region 168 of the chart. The $S_{22}$ parameters of the combined circuit in the second order harmonic RF frequency range are plotted in a sixth region 170 of the chart.

Generally speaking, the high-pass impedance transformer 126 is configured to provide impedance matching of the RF signal in the RF frequency range. That is, the high-pass impedance transformer 126 is tailored to step up the impedance of the amplifier circuit 100 in the RF frequency range from the characteristic input impedance of the RF amplifier 102 as seen at the first terminal 104 to a higher value as seen at the second internal node 130 of the multi-stage impedance matching network 110. Meanwhile, in the second order harmonic frequency range, the high-pass impedance transformer 126 is configured to transmit the RF signal with minimal reflection. In this way, the frequency components of the RF signal in the second harmonic frequency range are transferred from the first terminal 104 to the second internal node 130 of the multi-stage impedance matching network 110 and then these frequency components in the second harmonic frequency range can interact with the phase shifter 124 and the broadband impedance transformer.

Referring to FIG. 5C, an exemplary circuit topology for the high pass impedance transformer 126 is depicted, according to an embodiment. This circuit topology includes a series resistor 172, a shunt inductor 174, and a very large capacitor 176 that is configured to block DC signals and low frequencies that are below the RF frequency range. By including the series resistor 172 in the high pass matching network, the resistive component of the impedance presented by the multi-stage impedance matching network 110 as seen at the second internal node 130 is increased, which relaxes next stage impedance transformation. Advantageously, this series resistor 172 can be integrated in the gate of a transistor that is used to provide the RF amplifier 102 device.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "electrically connected" describes a permanent low-ohmic connection between electrically connected elements, for example a wire connection between the concerned elements. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An amplifier circuit, comprising:
   an RF amplifier configured to amplify an RF signal as between a first terminal and a second terminal across an RF frequency range that includes a fundamental RF frequency; and
   a multi-stage impedance matching network comprising a broadband impedance transformer, a phase shifter, and a high-pass impedance transformer,
   wherein the broadband impedance transformer, the phase shifter, and the high-pass impedance transformer are connected in series with one another between a first port of the amplifier circuit and the first terminal,
   wherein:
      the broadband impedance transformer transmits the RF signal in the RF frequency range while providing impedance transformation in the RF frequency range,
      the phase shifter shifts a phase output port reflection coefficient in a second order harmonic frequency range that overlaps with a second order harmonic of the fundamental RF frequency; and
      the high-pass impedance transformer transmits an RF signal in the RF frequency range while providing impedance transformation in the RF frequency range and transmits RF signals in the second order harmonic frequency range with low impedance.

2. The amplifier circuit of claim 1, wherein an output port reflection coefficient profile of the high-pass impedance transformer comprises, in a first frequency region corresponding to the RF frequency range, a maximum value that the output port reflection coefficient remains below across the entire first frequency region, and wherein, in a second frequency region of the reflection coefficient profile corresponding to the second order harmonic frequency range, the reflection coefficient profile remains above the maximum value across the entire second frequency region.

3. The amplifier circuit of claim 2, wherein the output port reflection coefficient profile of the high-pass impedance transformer comprises, in the first frequency region, a local minima situated between two maxima, and wherein, in the second frequency region of the reflection coefficient profile, the reflection coefficient profile remains above the two maxima.

4. The amplifier circuit of claim 3, wherein the local minima is substantially close to the fundamental RF frequency.

5. The amplifier circuit of claim 2, wherein in the second frequency region, the broadband impedance transformer reflects at least twenty five percent of a voltage of the RF signal at its output port.

6. The amplifier circuit of claim 2, wherein, in the RF frequency range, a characteristic impedance of the phase shifter is substantially the same as a matched impedance of the RF amplifier with the high pass matching network.

7. The amplifier circuit of claim 2, wherein the phase shifter shifts a phase of a reflection coefficient profile of the multi-stage impedance matching network in the second frequency region, as seen at an output port of the phase shifter, without substantially altering the reflection coefficient profile of the multi-stage impedance matching network.

8. The amplifier circuit of claim 2, the high-pass impedance transformer provides impedance matching of the RF signal in the RF frequency range and transmits higher order harmonics of the RF signal to the phase shifter with low reflection.

9. The amplifier circuit of claim 2, wherein the RF amplifier is a transistor comprising gate, source and drain terminals, wherein the first terminal corresponds to the gate terminal of the transistor, wherein the second terminal corresponds to the drain terminal of the transistor.

10. The amplifier circuit of claim 2, wherein the RF amplifier is a transistor comprising base, emitter and collector terminals, wherein the first terminal corresponds to the emitter terminal of the transistor, wherein the second terminal corresponds to the base terminal of the transistor.

11. An impedance matching circuit, comprising:
a network of reactive components that are configured to match a characteristic impedance of an amplifier device to a fixed impedance value across an RF frequency range that includes a fundamental RF frequency,
wherein the network of reactive components comprises a high-pass impedance transformer, a phase shifter and a broadband impedance transformer connected in series with one another between an input port and an output port of the impedance matching circuit,
wherein parameters of the broadband impedance transformer are such that the broadband impedance transformer transmits an RF signal in the RF frequency range while providing impedance matching in the RF frequency range,
wherein parameters of the phase shifter are such that higher order harmonics of the RF signal are phase shifted while the RF signal in the RF frequency is transmitted with matched impedance, and
wherein parameters of the high-pass impedance transformer are such that high-pass impedance transformer matches an impedance of the RF signal in the RF frequency range while transmitting with low reflection RF signals that are in a second order harmonic frequency range that overlaps with a second order harmonic of the fundamental RF frequency.

12. The impedance matching circuit of claim 11, wherein an output port reflection coefficient profile of the high-pass impedance transformer comprises, in a first frequency region corresponding to the RF frequency range, a maximum value that the output port reflection coefficient remains below across the entire first frequency region, and wherein, in a second frequency region of the reflection coefficient profile corresponding to the second order harmonic frequency range, the reflection coefficient profile remains above the maximum value across the entire second frequency region.

13. The impedance matching circuit of claim 12, wherein the output port reflection coefficient profile of the high-pass impedance transformer comprises, in the first frequency region, a local minima situated between two maxima, and wherein, in the second frequency region of the reflection coefficient, the reflection coefficient profile remains above the two maxima.

14. The impedance matching circuit of claim 13, wherein the local minima is substantially close to the fundamental RF frequency.

15. The impedance matching circuit of claim 12, wherein in the second frequency region, the broadband impedance transformer reflects at least twenty five percent of a second order harmonic of the fundamental RF frequency.

16. The impedance matching circuit of claim 11, wherein the broadband impedance transformer comprises two quarter wavelength transmission lines.

17. The impedance matching circuit of claim 11, wherein the phase shifter comprises a transmission line having a characteristic impedance that is substantially close to the characteristic impedance of one end of the broadband impedance transformer in the RF frequency range.

18. The impedance matching circuit of claim 11, wherein the phase shifter comprises a network of lumped element capacitors and inductors that collectively provide a characteristic impedance that is substantially close to the characteristic impedance of one end of the broadband impedance transformer in the RF frequency range.

19. The impedance matching circuit of claim 11, wherein the high-pass impedance transformer comprises an inductor and a capacitor arranged in a shunt configuration and a resistor connected in series with the phase shifter.

20. The impedance matching circuit of claim 19, wherein parameters of the capacitor are such that the capacitor appears as an RF short in the RF frequency range and an RF open at low frequencies that are below the RF frequency range.

* * * * *